(12) United States Patent
Alford et al.

(10) Patent No.: US 9,988,713 B2
(45) Date of Patent: Jun. 5, 2018

(54) THIN FILM DEVICES AND METHODS FOR PREPARING THIN FILM DEVICES

(71) Applicants: Terry Alford, Tempe, AZ (US); Sayantan Das, Tempe, AZ (US)

(72) Inventors: Terry Alford, Tempe, AZ (US); Sayantan Das, Tempe, AZ (US)

(73) Assignee: Arizona Board of Regents on Behalf of Arizona State University, Scottsdale, AZ (US)

( * ) Notice: Subject to any disclaimer, the term of this patent is extended or adjusted under 35 U.S.C. 154(b) by 309 days.

(21) Appl. No.: 14/205,933

(22) Filed: Mar. 12, 2014

(65) Prior Publication Data

US 2014/0272396 A1    Sep. 18, 2014

Related U.S. Application Data

(60) Provisional application No. 61/776,881, filed on Mar. 12, 2013.

(51) Int. Cl.
*C23C 14/58*    (2006.01)
*C23C 14/35*    (2006.01)
*C23C 14/20*    (2006.01)

(52) U.S. Cl.
CPC .......... *C23C 14/5853* (2013.01); *C23C 14/20* (2013.01); *C23C 14/205* (2013.01); *C23C 14/352* (2013.01); *C23C 14/5826* (2013.01); *Y10T 428/24355* (2015.01); *Y10T 428/265* (2015.01); *Y10T 428/31678* (2015.04); *Y10T 428/31681* (2015.04)

(58) Field of Classification Search
CPC .............. C23C 14/5853; C23C 14/205; C23C 14/5826; C23C 14/14; C23C 14/20; C23C 14/352; Y10T 428/24355; Y10T 428/265; Y10T 428/31678; Y10T 428/31681
USPC .......................................................... 427/553
See application file for complete search history.

(56) References Cited

U.S. PATENT DOCUMENTS

| 4,490,183 A | 12/1984 | Scovell |
| 4,931,424 A | 6/1990 | Henty |
| 5,082,688 A | 1/1992 | Agostinelli et al. |
| 5,288,456 A | 2/1994 | Aboelfotoh et al. |
| 5,443,863 A | 8/1995 | Neely et al. |

(Continued)

FOREIGN PATENT DOCUMENTS

EP    0472804 B1    7/1997

OTHER PUBLICATIONS

Chang, H.J.; Huang, K.M.; Chen, S.F.; Huang, T.H.; Wu, M.C.; "RF Sputtered Low-Resistivity and High-Transmittance Indium Gallium Zinc Oxide Films for Near-UV Applications", 2011, ECS, p. H132-H134.*

(Continued)

*Primary Examiner* — Katherine A Bareford
*Assistant Examiner* — Christina D McClure
(74) *Attorney, Agent, or Firm* — Quarles & Brady LLP

(57) ABSTRACT

A method for preparing a device having a film on a substrate is disclosed. In the method, a film is deposited on a polymeric substrate. The film includes at least one metal. A metal in the film is converted to a metal oxide using microwave radiation. One example device prepared by the method includes a polyethylene napthalate substrate and a film on the substrate, wherein the film includes a semiconducting copper oxide and silver as a dopant.

19 Claims, 3 Drawing Sheets

(56) References Cited

U.S. PATENT DOCUMENTS

| | | | |
|---|---|---|---|
| 5,695,810 A * | 12/1997 | Dubin | C23C 18/1603 |
| | | | 257/E21.584 |
| 5,707,466 A | 1/1998 | Atwater et al. | |
| 5,855,993 A | 1/1999 | Brady et al. | |
| 5,962,116 A * | 10/1999 | Triquet | C23C 8/10 |
| | | | 427/255.26 |
| 6,046,108 A | 4/2000 | Liu et al. | |
| 6,172,322 B1 | 1/2001 | Shang et al. | |
| 6,183,689 B1 | 2/2001 | Roy et al. | |
| 6,821,890 B2 | 11/2004 | McGahay et al. | |
| 7,901,609 B2 | 3/2011 | Xiong et al. | |
| 8,257,995 B2 | 9/2012 | Hilali et al. | |
| 2007/0003475 A1* | 1/2007 | Lim | B01J 23/745 |
| | | | 423/648.1 |
| 2007/0004582 A1* | 1/2007 | Lim | B01J 23/745 |
| | | | 502/22 |
| 2007/0080067 A1* | 4/2007 | Gu | C23C 14/16 |
| | | | 205/183 |
| 2007/0243337 A1* | 10/2007 | Xiong | B82Y 30/00 |
| | | | 427/553 |
| 2009/0090942 A1* | 4/2009 | Kim | H01L 27/124 |
| | | | 257/288 |
| 2009/0134521 A1 | 5/2009 | Liu et al. | |
| 2010/0151130 A1 | 6/2010 | Ammerlaan et al. | |
| 2010/0176394 A1* | 7/2010 | Park | H01L 29/7869 |
| | | | 257/43 |
| 2010/0184253 A1* | 7/2010 | Hirai | H01L 29/7869 |
| | | | 438/104 |
| 2010/0206720 A1 | 8/2010 | Lin et al. | |
| 2011/0262742 A1* | 10/2011 | Takeuchi | C23C 28/04 |
| | | | 428/339 |

OTHER PUBLICATIONS

The Periodic Table of the Elements, 2015, p. 1.*
Harris, Bryan, "Engineering Composite Materials", 1999, Maney Publishing for IOM3, the Institute of Materials, Minerals and Mining, $2^{nd}$ Ed. p. 1.*
Lin, C.H., Leau, W.K., "Copper-Silver Alloy for Advanced Barrierless Metallization", 2009, J. Electron. Mater., 38, p. 2212-2221.*
Aboelfotoh et al., Novel low-resistance ohmic contact to n-type GaAs using Cu3Ge, Appl. Phys. Lett., vol. 65, No. 25, 1994, pp. 3245-3247.
Bale et al., FactSage Thermochemical Software and Databases, Calphad, vol. 26, No. 2, 2002, pp. 189-228.
Barmak et al., Texture of Cu and dilute binary Cu-alloy films: impact of annealing and solute content, Mater. Sci. Semi. Proc., vol. 6, 2003, pp. 175-184.
Blobaum et al., Sputter-deposition and characterization of paramelaconite, J. Mater. Res., vol. 18, No. 7, 2003, pp 1535-1542.
Borek et al., Low resistivity copper germanide on (100) Si for contacts and interconnections, Appl. Phys. Lett., vol. 69, No. 23, 1996, pp. 3560-3562.
Caspi et al., Pressure effect on the magnetic and crystallographic structures in the U(Nil-xCux)2Ge2 system, J. Alloy Compounds, 271-273, 1998, pp. 378-381.
Das et al., Microwave assisted low temperature encapsulation of Ag films by Cu reactions using Ag—Cu alloy structures, Mater. Lett., vol. 89, 2012, pp. 163-165.
Das et al., Structural and optical properties of Ag-doped copper oxide thin films on polyethylene napthalate substrate prepared by low temperature microwave annealing, J. Appl. Phys., vol. 113, 244905, 2013, pp. 1-6.
Dhar et al., Room-temperature synthesis of copper germanide phase by ion beam mixing, Appl. Phys. Lett., vol. 67, No. 12, 1995, pp. 1700-1702.
Doolittle, Algorithms for the rapid simulation of Rutherford backscattering spectra, Nuc. Inst. Meth. Phys. Res., vol. B9, 1985, pp. 344-351.
Erofeev et al., A gold free fully Cu/Ge metalized GaAs pHEMT for the high frequency applications, IEEE, 2011 International Siberian Conference on Control and Communications SIBCON, 2011, pp. 261-264.
Gaudet et al., Thin film reaction of transition metals with germanium, J. Vac. Sci. Technol., vol. 24, No. 3, 2006, pp. 474-485.
Goel et al., Substitution site effect on structural and dielectric properties of La—Bi modified PZT, J. Mater. Sci., vol. 21, pp. 3928-3935.
Han et al., Improved surface morphology and texture of Ag films on indium tin oxide via Cu additions, J. Appl. Phys., vol. 102, 2007, 036101, pp. 1-3.
Her et al., Phase transformation and crystallization kinetics of a-Ge/Cu bilayer for blue-ray recording under thermal annealing and pulsed laser irradiation, J. Appl. Phys., vol. 111, 043503, 2012, pp. 1-6.
Huang et al., Influence of Ag doped CuO nanosheet arrays on electrochemical behaviors for supercapacitors, Electrochimica Acta, vol. 75, 2012, pp. 208-212.
Indluru et al., Effect of Ag thickness on electrical transport and optical properties of indium tin oxide-Ag-indium tin oxide multilayers, J. Appl. Phys., vol. 105, 123528, 2009, pp. 1-9.
Ishihara et al., Preparation of CuO thin films on porous BaTiO3 by self-assembled multibilayer film formation and application as a CO2 sensor, J. Mater. Chem., vol. 8, No. 9, 1998, pp. 2037-2042.
Joi et al., Pulse plating of copper germanide, Appl. Phys. Lett., vol. 102, 134107, 2013, pp. 1-4.
Krusin-Elbaum et al., Unusually low resistivity of copper germanide thin films formed at low temperatures, Appl. Phys. Lett. vol. 58, No. 12, 1991, pp. 1341-1343.
Lee et al., Copper oxide reduction through vacuum annealing, Appl. Surf. Sci., vol. 206, 2003, pp. 102-109.
Li et al., Role of Surface/Interfacial Cu2+ Sites in the Photocatalytic Activity of Coupled CuO—TiO2 Nanocomposites, J. Phys. Chem., vol. 112, 2008, pp. 19040-19044.
Liou et al., Oxidation of Cu and Cu3Ge thin films, J. Appl. Phys., vol. 77, No. 10, 1995, pp. 5443-5445.
Marabelli et al., Optical gap of CuO, Phys. Rev. B, vol. 52, No. 3, 1995, pp. 1433-1436.
Maruyama, Copper oxide thin films prepared by chemical vapor deposition from copper dipivaloylmethanate, Sol. Engy. Mat. Sol. Cells, vol. 56, 1998, pp. 85-92.
Morgan et al., Sythesis of Paramelaconite: Cu4O3, J. Solid State Chem., vol. 121, 1996, pp. 33-37.
Peng et al., Functionalization of silver nanowire surfaces with copper oxide for surface-enhanced Raman spectroscopic bio-sensing, J. Mater. Chem. vol. 22, 2012, pp. 15495-15499.
Peter et al., Selective chemical vapor synthesis of Cu3Ge: Process optimization and film properties, Intermetallics, vol. 34, 2013, pp. 35-42.
Shirley, High-resolution X-ray photoemission spectrum of the valence bands of gold, Phys. Rev. B, vol. 5, No. 12, 1972, pp. 4709-4714.
Wang et al., Formation of aluminum oxynitride diffusion barriers for Ag metallization, Appl. Phys. Lett., vol. 74, No. 1, 1999, pp. 52-54.
Wang et al., Preparation and catalytic properties of Ag/CuO nanocomposites via a new method, Mater. Chem. Phys., vol. 108, 2008, pp. 165-169.
B. Reeja-Jayan et al.; Microwave-assisted Low-temperature Growth of Thin Films in Solution; 2 Scientific Reports, 1 (2012).
B. Meyer et al., Binary Copper Oxide Semiconductors: From Materials Towards Devices; 8 Phys. Status Solidi, 1487-1509 (2012).
Micro-Mode Microwave of DSG Technologies, dated Feb. 28, 2014.

* cited by examiner

THIN FILM DEVICES AND METHODS FOR PREPARING THIN FILM DEVICES

CROSS-REFERENCES TO RELATED APPLICATIONS

This application claims the benefit of U.S. Provisional Patent Application No. 61/776,881 filed on Mar. 12, 2013.

STATEMENT REGARDING FEDERALLY SPONSORED RESEARCH

Not Applicable.

BACKGROUND OF THE INVENTION

1. Field of the Invention

The invention relates to methods for forming a metal oxide film on a polymeric substrate.

2. Description of the Related Art

Transition metal oxides have gained considerable interest recently due to their potential application in solar cells (see, Maruyama, *Solar Energy Mater. Solar Cells* 56 (1998) 85), heterogeneous catalysis (see, Li et al., *J. Phys. Chem. C*, 112 (2008) 19040), gas sensors (see, Ishihara et al., *J. Mater. Chem.*, 8 (1998) 2037), and supercapacitors (see, Huang et al., *Electrochimica Acta* 75 (2012) 208). Among transition metal oxides, copper oxides are non toxic and the abundant availability of copper makes copper oxides a cheap material for many applications. Cupric oxide is a p-type semiconductor with an indirect band gap of 1.2-1.5 eV (see, Marabelli et al., *Phys. Rev. B: Condens. Matter*, 52 (1995) 1433). The application of CuO as a selective absorbing layer in solar cells has been reported because of its high solar absorption.

Polymeric substrates offer added advantages over traditional rigid substrates like glass in terms of light weight and flexibility. However, fabrication of devices on flexible substrates is a challenge owing to the low temperature tolerance of the polymers. Typically, high temperatures are required to grow semiconducting oxides like copper oxide. This limits the growth of these oxides on polymer substrates like polyethylene napthalate.

Therefore, what is needed is an improved method for forming a metal oxide film on a polymeric substrate.

SUMMARY OF THE INVENTION

The present invention provides a method for preparing a device having a film on a substrate. In the method, a film is deposited on a polymeric substrate. The film includes at least one metal. A metal in the film is converted to a metal oxide using microwave radiation.

The present invention also provides a device comprising a polymeric substrate and a film on the substrate, wherein the film includes a copper oxide and a metal dopant.

As a non-limiting example, the present invention discloses the preparation of Ag doped CuO thin films on a flexible polymeric substrate comprising polyethylene naphthalate (PEN) using microwave radiation to oxidize copper films to CuO.

It is an advantage of the invention to provide an improved method for preparing a device having a metal oxide film on a polymeric substrate. Low temperature and quicker processing methods of the invention result in a device with improved properties compared to a device prepared using conventional annealing techniques.

It is another advantage of the invention to provide a low temperature oxidation technique to oxidize metallic films to metal oxides (e.g., copper oxides).

It is yet another advantage of the invention to provide metal doped metal oxide thin films (e.g., silver doped copper oxides) on a polymeric substrate that are stable after microwave annealing.

It is still another advantage of the invention to provide an inexpensive, fast, energy efficient and environmental friendly process to grow thin film metal oxides.

In one aspect, the present invention discloses a method for preparing a device having a film on a substrate, and the method comprises the steps of (a) providing a polymeric substrate; (b) depositing a film on the polymeric substrate, the film including a metal; and (c) converting the metal in the film to a metal oxide using microwave radiation.

In one embodiment of the present method, the metal oxide is a semiconducting oxide. Specifically, the metal oxide is selected from copper oxide, zinc oxide, tin oxide, indium oxide, and gallium oxide. Preferably, the metal oxide is copper oxide.

In one embodiment, the film includes an additional metal. Specifically, step (b) comprises co-sputtering the metal and the additional metal. More specifically, the additional metal is silver, and the additional metal is present in the film at an atomic percentage of 1% to 10%. Preferably, the additional metal occupies lattice sites in the copper oxide.

In one embodiment, the polymeric substrate comprises a polymeric material selected from the group consisting of polyethylene napthalate, polyethylene terephthalate, polyethersulphone, polyarylate, polyimide, and mixtures thereof. Preferably, the polymeric substrate comprises polyethylene napthalate. More preferably, the polymeric substrate is flexible.

In one embodiment, the film has a thickness of 1 to 100 nanometers. Specifically, before step (c), the film is amorphous. After step (c), the film is polycrystalline. After step (c), the film has an RMS surface roughness of 1.2 nanometers or less as measured using atomic force microscopy. Preferably, after step (c), the film has an optical transmittance above 25% at a wavelength of 400 to 800 nanometers.

In one embodiment, the microwave radiation has a frequency of 1 to 5 GHz. In step (c), the microwave radiation is used for less than one minute. A maximum temperature during step (c) is below 50° C.

In one aspect, the present invention discloses a device comprising a polymeric substrate; and a film on the substrate, the film including copper oxide and a metal dopant.

In one embodiment of the device, the polymeric substrate comprises a polymeric material selected from the group consisting of polyethylene napthalate, polyethylene terephthalate, polyethersulphone, polyarylate, polyimide, and mixtures thereof. Preferably, the polymeric substrate comprises polyethylene napthalate. More preferably, the polymeric substrate is flexible.

In one embodiment, the metal dopant is present in the copper oxide at an atomic percentage of 1% to 10%. Specifically, the metal dopant occupies copper lattice sites. More specifically, the metal dopant is silver.

In one embodiment, the film has a thickness of 1 to 100 nanometers. Preferably, the film has a thickness of 10 to 30 nanometers.

In one embodiment, the film is polycrystalline. The film has an RMS surface roughness of 1.2 nanometers or less as measured using atomic force microscopy. The film is opaque below 380 nanometers as measured by optical transmittance.

In one embodiment, the film has an optical transmittance above 25% at a wavelength of 400 to 800 nanometers.

These and other features, aspects, and advantages of the present invention will become better understood upon consideration of the following detailed description, drawings and appended claims.

DETAILED DESCRIPTION OF THE INVENTION

Figure 1:
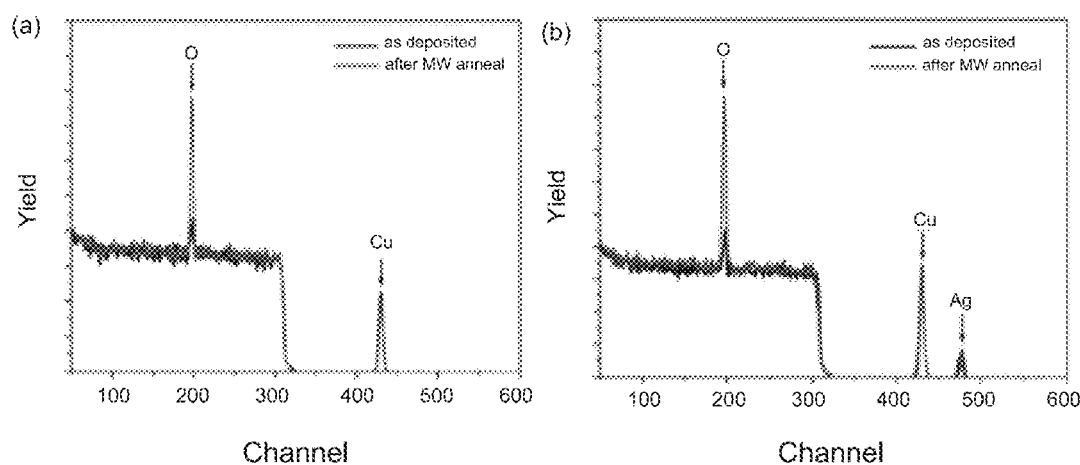
FIG. 1 shows Rutherford Backscattering Spectrometry (RBS) spectra obtained from (a) Cu and (b) Cu—Ag films before and after 30 seconds of microwave annealing showing the growth of a thin copper oxide layer. The spectra were obtained using a 3.05 MeV $He^{++}$ beam and a scattering angle of 8°.

A method according to the invention for preparing a device having a film on a substrate uses a polymeric substrate. The method for preparing a device having a film on a substrate may comprise the steps of (a) providing a polymeric substrate; (b) depositing a film on the polymeric substrate, the film including a metal; and (c) converting the metal in the film to a metal oxide using microwave radiation.

A substrate may comprise any suitable conductive polymers. The suitable conductive polymers may include derivatives of polyacetylene, polyaniline, polypyrrole or polythiophenes. These polymers have conjugated double bonds which allow for conduction. Non-limiting example substrates comprise a polymeric material selected from the group consisting of polyethylene napthalate, polyethylene terephthalate, polyethersulphone, polyarylate, polyimide, poly(3,4-ethylenedioxythiophene) (PEDOT), poly(4,4-dioctylcyclopentadithiophene), poly(3,4-ethylenedioxythiophene) PEDOT: poly(styrene sulfonate) PSS, poly(4,4-dioctylcyclopentadithiophene), and mixtures thereof. A preferred polymeric substrate comprises polyethylene napthalate. Preferably, the polymeric substrate is flexible.

In one embodiment, the substrate may comprise organic films which are being developed using carbon nanotube networks and graphene, which can be fabricated to be highly transparent to infrared light, along with networks of polymers such as poly(3,4-ethylenedioxythiophene) and its derivatives.

A film including at least one metal is deposited on the polymeric substrate. Sputtering of one or more metals is one suitable technique for depositing the metal(s) on the polymeric substrate; however, other deposition processes (electrodeposition, sol-gel, spray) may be suitable. The film can have various thicknesses, such as 1 to 1000 nanometers, or 1 to 300 nanometers, or 1 to 100 nanometers, or 1 to 50 nanometers, or 1 to 30 nanometers, or 10 to 30 nanometers.

In one embodiment, the deposition of a metal film on a substrate may be conducted in an air-tight environment, such as those under high vacuum and with noble-gas purge. For example, a suitable air-tight environment may have a pressure of at least $2 \times 10^{-6}$ Torr and the air-tight environment may be purged by argon gas.

At least one metal that is deposited on the film is converted to a metal oxide using microwave radiation. Any suitable microwave may be used for the present application, such as commercially available microwaves. Preferably, the metal oxide is a semiconducting oxide. Non-limiting example semiconducting metal oxides are copper oxide, zinc oxide, tin oxide, indium oxide, gallium oxide, and mixtures thereof. The semiconducting metal oxides may include any transition metal oxides and other metal oxides. For example, the semiconducting metal oxides may comprise nickel oxide, iron oxide, cobalt oxide, manganese oxide, titanium oxide, chromium oxide, cadmium oxide, silver oxide, zirconium oxide, vanadium oxide, molybdenum oxide, niobium oxide, rhenium oxide, aluminum oxide, and mixtures thereof.

Preferably, the metal oxide is copper oxide. Thus, the choice of metal(s) in the film on the polymeric substrate can determine the metal oxide created on the polymeric substrate.

Before converting the metal in the film to a metal oxide using microwave radiation, the film can be amorphous. After converting the metal in the film to a metal oxide using microwave radiation, the film can be polycrystalline. After converting the metal in the film to a metal oxide using microwave radiation, the film can have an RMS surface roughness of 1.2 nanometers or less as measured using atomic force microscopy. After converting the metal in the film to a metal oxide using microwave radiation, the film can have an optical transmittance above 25% at a wavelength of 400 to 800 nanometers, preferably, the optical transmittance is above 40% at a wavelength of 400 to 800 nanometers.

In one version of the method, the metal that is deposited on the film is converted to a metal oxide using microwave radiation having a frequency of 0.3 to 300 GHz, or 1 to 100 GHz, or 1 to 50 GHz, or 1 to 25 GHz, or 1 to 10 GHz, or 1 to 5 GHz. In one version of the method, the metal that is deposited on the film is converted to a metal oxide using microwave radiation applied for less than ten minutes, or less than five minutes, or less than one minute. Preferably, a maximum temperature reached during application of the microwave radiation is below 150° C., or below 100° C., or below 50° C.

The film may include an additional metal such as a dopant for the metal oxide. The dopant can be a noble metal such as silver. Other metals may also be used as the dopant for the metal oxide. When an additional metal is used, the metal and the additional metal can be co-sputtered on the film. Various atomic percentages of the additional metal can be used in the film such as an atomic percentage of 1% to 10%, or 1% to 7%. In one version of the method, the additional metal occupies lattice sites in the resulting metal oxide.

One device prepared by a method according to the invention has a polymeric substrate and a film on the substrate wherein the film includes copper oxide and a metal dopant. Preferably, the copper oxide is semiconducting. The copper oxide can be CuO, or $Cu_4O_3$, or $Cu_2O$. The polymeric substrate of the device can comprise a polymeric material selected from the group consisting of polyethylene napthalate, polyethylene terephthalate, polyethersulphone, polyarylate, polyimide, poly(3,4-ethylenedioxythiophene) (PEDOT), poly(4,4-dioctylcyclopentadithiophene), poly(3,4-ethylenedioxythiophene) PEDOT: poly(styrene sulfonate) PSS, poly(4,4-dioctylcyclopentadithiophene), and mixtures thereof. Preferably, the polymeric substrate of the device comprises polyethylene napthalate. The polymeric substrate of the device can be flexible. The metal dopant can be silver which is present in the copper oxide at an atomic percentage of 1% to 10%. The metal dopant can occupy copper lattice sites in the copper oxide.

In one aspect, the present invention discloses a device having a metal oxide film on a polymeric substrate. The metal oxide film on a polymeric substrate may be produced from any methods as discussed above. The device may include any suitable metal oxide films and any polymeric substrates as discussed above.

The film of the device can have various thicknesses of such as 1 to 1000 nanometers, or 1 to 300 nanometers, or 1 to 100 nanometers, or 1 to 50 nanometers, or 1 to 30 nanometers, or 10 to 30 nanometers. The film of the device can be polycrystalline. The film of the device can have an RMS surface roughness of 1.2 nanometers or less as measured using atomic force microscopy. The film of the device can be opaque below 380 nanometers as measured by optical transmittance, and can have an optical transmittance above 25% at a wavelength of 400 to 800 nanometers, and preferably, the optical transmittance is above 40% at a wavelength of 400 to 800 nanometers.

In one non-limiting example version of the invention, silver doped cupric oxide thin films are prepared on a polyethylene naphthalate flexible substrate. Thin films of copper and silver-doped copper are deposited on the substrate by co-sputtering followed by microwave assisted oxidation of the metal films. The low temperature tolerance of the polymer substrates is not a problem for the new low temperature processing techniques according to the invention. Cupric oxide is a p-type semiconductor with an indirect band gap and is used as a selective absorption layer. Rutherford Backscattering Spectrometry measurements were done to confirm the formation of copper oxides. X-ray diffraction identified the CuO phase. The transparent Ag doped CuO offers potential applications in areas of photocatalysis, electronics and optics.

EXAMPLES

The following Examples are provided in order to demonstrate and further illustrate certain embodiments and aspects of the present invention and are not to be construed as limiting the scope of the invention.

Example 1

Experiments

Cu and Cu—Ag films were deposited on PEN and Si substrates by a DC magnetron sputtering system under vacuum using pure Cu and Ag targets (99.995% purity). The sputtering system was first pumped down to $2 \times 10^{-6}$ Torr and then argon gas was introduced to fill up the chamber. The depositions were done at room temperature at 10 mTorr pressure. This was followed by annealing the films inside a 2.45 GHz microwave cavity for 30 seconds. The temperature during the annealing process was measured using a Rayteck Compact MID pyrometer. The maximum temperature reached during the microwave annealing process was 45° C. The thickness and compositions of the as-deposited and the microwave annealed films were measured using RBS and computer simulation program RUMP (see, Doolittle et al., *Nucl. Instrum. Methods, Phys Res B*9 (1985) 344). Variable angle spectroscopic ellipsometry (VASE) analysis was done to determine the thickness of the films. The structural properties of the as-deposited and annealed films were investigated by x-ray diffraction (XRD). Optical transmittance of the films was measured using an Ocean Optics double channel spectrometer (model DS200) in a wavelength range of 300-800 nanometers. Surface topography was evaluated using atomic force microscopy (AFM) in tapping mode.

Results and Discussion

The deposition time for the films was fixed for 1 minute followed by microwave annealing for 30 seconds. The results of RBS characterizations for CuO and 6 atomic % Ag doped CuO thin films are shown in FIGS. 1*a* and *b*. RBS were done on films deposited and processed on Si due to the ease of simulation on Si wafers. In case of as deposited samples, a small oxygen signal near channel 200 suggests the presence of oxygen at the surface of the films. After microwave annealing, the enhanced oxygen signal suggests the formation of a thick oxide layer. The shift in the Ag signal towards left in FIG. 1*b* after microwave annealing suggests that Ag diffuses from the surface towards the bulk CuO. The thickness of the films as determined by VASE and Ag content in the co-sputtered films obtained after RBS measurements and RUMP simulation are detailed in Table 1 below.

Figure 2:
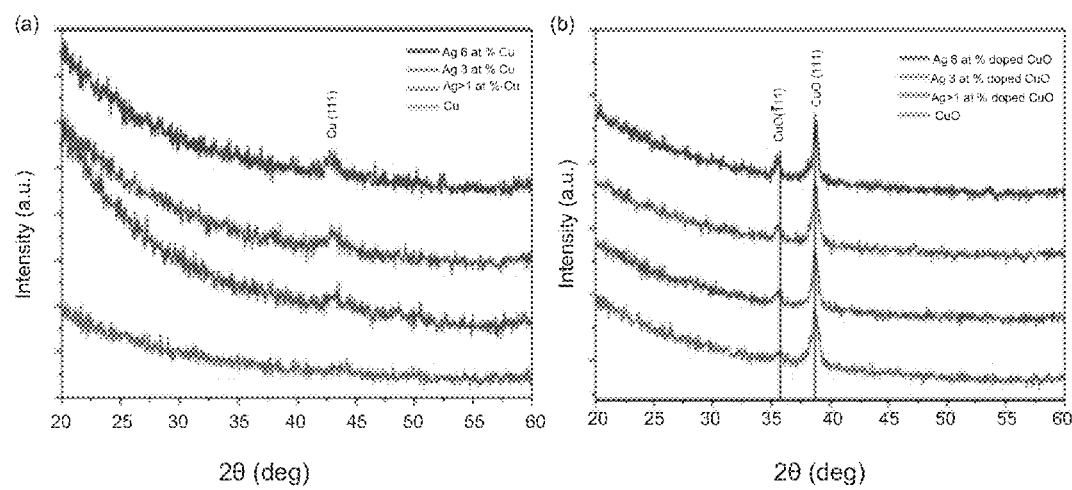
FIG. 2 shows X-Ray Diffraction (XRD) patterns showing (a) the amorphous nature of the as-deposited films, and (b) growth of CuO after microwave annealing.

Glancing angle XRD using Cu Kα radiation was done to identify the phases in the films. FIG. 2 shows the XRD pattern of as deposited and microwave annealed films indicating that the as deposited films were amorphous in nature and the annealed films were polycrystalline in nature. JCPDS card 89-5895 was used to identify the CuO peaks. After microwave annealing, the films show CuO peak at 35.5 and 38.7 (2 theta) corresponding to the ($\bar{1}$11) and (111) reflection of the monoclinic structure of cupric oxide (CuO) respectively. A slight shift of the CuO ($\bar{1}$11) peak in the Ag-doped films towards lower diffraction angle indicates that the Ag atoms are occupying the Cu lattice sites. However, the position of CuO (111) peak remains the same. The full width at half maximum (FWHM) of the CuO (111) reflection peak also remains virtually constant with silver doping however it decreases for the CuO ($\bar{1}$11) peaks with increase in Ag content.

Figure 3:
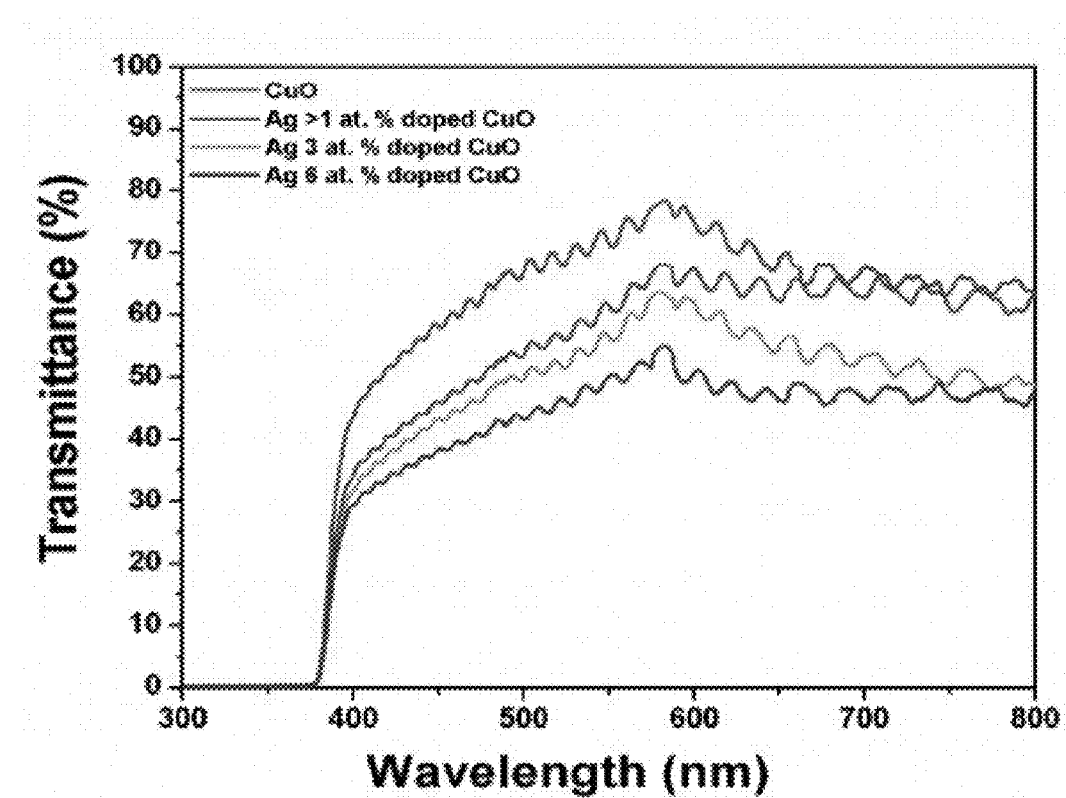
FIG. 3 shows a comparison of the transmittance spectra of CuO films doped with different Ag concentrations.
Figure 4:
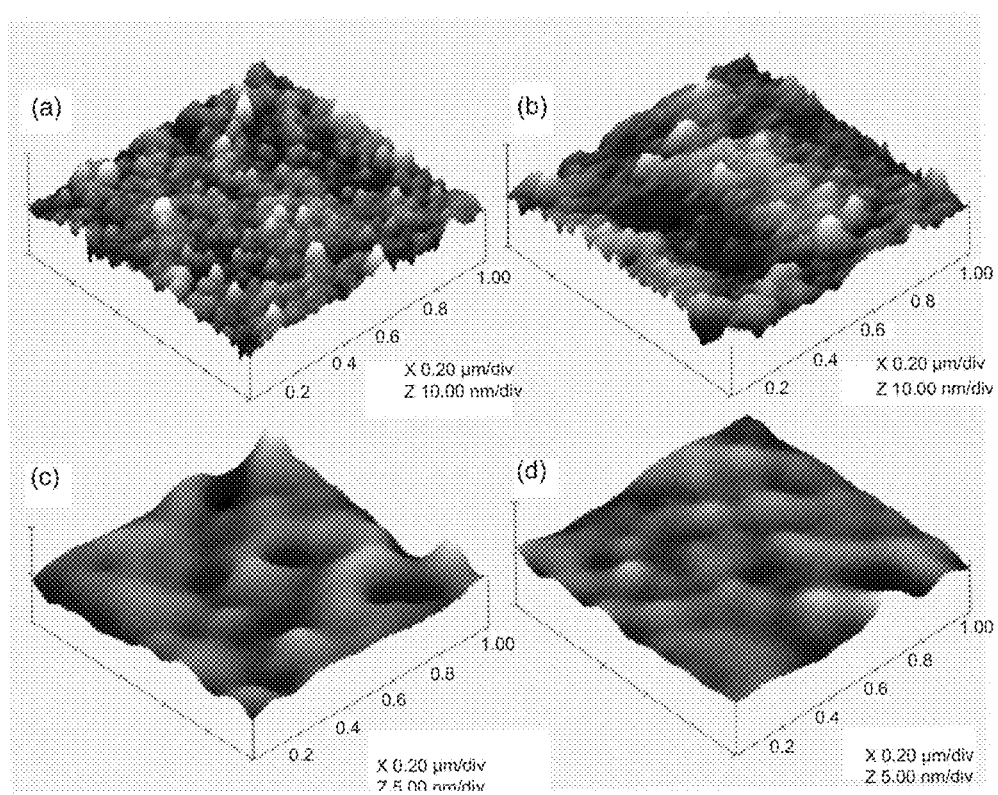
FIG. 4 shows Atomic Force Microscopy (AFM) images of CuO thin films with: (a) 0%, (b) >1%, (c) 3%, and (d) 5% of Ag doping.

FIG. 3 shows the transmission spectra of the copper oxide films on PEN. It is found that all the CuO films on PEN are opaque below 380 nanometers. The maximum transmittance of ~80% was observed around 600 nanometers for undoped CuO films. It is also noted that with increase in the Ag concentration, the transmittance decreases. In the blue part of the visible spectrum, the transmittance of the films decreases as the amount of silver increases. In the case of noble metals like silver, the transmittance in the blue region is determined by the absorption of light due to electronic transitions between occupied d states and unoccupied hybridized sp states above the Fermi level (see, Simmons et al., *Optical Materials* Academic, San Diego, 2000). With increase in silver content, the probability of interband electronic excitation increases and hence the greater drop in transmittance. In the red region, the transmittance of the films is governed by the reflectivity of silver, hence lower transmittance with increase in Ag content. The surface morphology of the undoped and doped Ag doped CuO films are shown in FIG. 4. It is found that the undoped films grow with microcrystalline structure. This was not observed in case of the Ag-doped CuO thin films. With increase in the Ag content in the CuO matrix, the surface roughness was found to decrease as documented in Table 1 below. These results indicate that the silver doping might act as a surfactant which lowers the surface tension between the CuO layers and the PEN substrates.

Thus, silver stabilized copper oxide thin films on polyethylene napthalate have been prepared using a novel microwave assisted process. This low temperature, low cost process allows for faster processing of films when compared to conventional thermal processing. The low temperature process enables the process to be conducted on flexible polymer substrates.

Microwaves are known to be reflected by bulk metals and thus cannot be used to heat bulk metals. However, the present invention shows that microwaves can be used to heat thin metallic films to their corresponding oxides. We used a microwave working at 2.45 GHz frequency to heat metallic copper on polyethylene napthalate to copper oxide.

TABLE 1

Ag content in CuO as determined by Rutherford Backscattering Spectrometry and RUMP computer simulation. Thickness of the films as determined by Variable Angle Spectroscopic Ellipsometry.

| Sample | Ag content (at. %) | Thickness (nm) | RMS roughness (nm) |
| --- | --- | --- | --- |
| CuO | 0 | 21 | 1.01 |
| Ag doped CuO | >1 | 18 | 1.16 |
| Ag doped CuO | 3 | 20 | 0.591 |
| Ag doped CuO | 6 | 19 | 0.283 |

Conclusions

In summary, Ag doped CuO thin films on polyethylene napthalate were prepared successfully by first co-sputtering pure metal films which was followed by oxidation of copper to CuO using microwave radiation. This facile approach allows low temperature, and faster and controllable growth of metal oxide films on polymer substrates. XRD results show the formation of CuO (111) and ($\bar{1}$11) peaks after microwave anneal. The transparent Ag doped CuO offers potential applications in areas of photocatalysis, electronics and optics.

Thus, the invention provides improved methods for forming a metal oxide film on a polymeric substrate. This work provides low cost solutions for photovoltaic device fabrication on flexible substrates. The use of microwave allows for lower processing temperatures and shorter times. This process is energy efficient and environmentally friendly.

The thin silver stabilized copper oxide films can be used as reagent free uric acid biosensors. Other potential applications of these films are in areas of photocatalysis, electronics and optics. The films are grown on flexible substrate (polyethylene napthalate) and thus they are light weight and easy to carry. The usage of copper oxide device applications is advantageous because of its abundant availability and non toxic nature of the materials used.

Although the invention has been described in considerable detail with reference to certain embodiments, one skilled in the art will appreciate that the present invention can be practiced by other than the described embodiments, which have been presented for purposes of illustration and not of limitation. Therefore, the scope of the appended claims should not be limited to the description of the embodiments contained herein.

What is claimed is:

1. A method for preparing a device having a film on a substrate, the method comprising:
    (a) providing a polymeric substrate;
    (b) depositing a film on the polymeric substrate by sputtering at least one metal in pure form; and
    (c) converting the metal in the film to a metal oxide having a thickness between 10 and 1000 nanometers by exposing the film to microwave radiation for less than ten minutes,
   wherein a maximum temperature during step (c) is below 50° C.

2. The method of claim 1 wherein:
   the metal oxide is a semiconducting oxide.

3. The method of claim 1 wherein:
   the metal oxide is selected from copper oxide, zinc oxide, tin oxide, indium oxide, and gallium oxide.

4. The method of claim 1 wherein:
   the film includes an additional metal.

5. The method of claim 4 wherein:
   the additional metal is silver.

6. The method of claim 1 wherein:
   the polymeric substrate comprises a polymeric material selected from the group consisting of polyethylene napthalate, polyethylene terephthalate, polyethersulphone, polyarylate, polyimide, and mixtures thereof.

7. The method of claim 1 wherein:
   the polymeric substrate comprises polyethylene napthalate.

8. The method of claim 1 wherein:
   the film has a thickness of 1 to 100 nanometers before converting a metal in the film to a metal oxide.

9. The method of claim 1 wherein:
   after step (c), the film has an optical transmittance above 25% at a wavelength of 400 to 800 nanometers.

10. A method for preparing a device having a film on a substrate, the method comprising:
    (a) providing a polymeric substrate;
    (b) depositing a film on the polymeric substrate by co-sputtering pure copper with an additional metal to create a thin film layer having an atomic percentage of at least about 90% copper; and
    (c) converting at least one metal in the film to a metal oxide having a thickness between 10 and 1000 nanometers by exposing the film to microwave radiation for less than ten minutes at a temperature below 50° C.

11. The method of claim 10 wherein:
    the additional metal is silver.

12. The method of claim 10 wherein:
    the thin film layer has an atomic percentage of at least about 93% copper.

13. The method of claim 10 wherein:
    the at least one metal in the film is converted into an oxide by exposing the film to microwave radiation for less than one minute.

14. A method of forming a device with a copper oxide thin film on a polymeric substrate, the method comprising:
    (a) providing a polymeric substrate;
    (b) depositing a film on the polymeric substrate by sputtering copper in pure form; and
    (c) converting the copper in the film to a copper oxide having a thickness between 10 and 1000 nanometers by exposing the film to microwave radiation for less than ten minutes;
   wherein a maximum temperature in step (c) is below 50° C.

15. The method of claim 14 wherein:
the film includes an additional metal.
16. The method of claim 15 wherein:
the additional metal is silver.
17. The method of claim 14 wherein:
the polymeric substrate comprises a polymeric material selected from the group consisting of polyethylene napthalate, polyethylene terephthalate, polyethersulphone, polyarylate, polyimide, and mixtures thereof.
18. The method of claim 17 wherein:
the polymeric substrate comprises polyethylene napthalate.
19. The method of claim 14 wherein:
the copper oxide includes CuO.

* * * * *